United States Patent
Plummer et al.

[11] Patent Number: 5,933,278
[45] Date of Patent: Aug. 3, 1999

[54] MONOLITHIC MULTI-FACETED MIRROR FOR COMBINING MULTIPLE BEAMS FROM DIFFERENT LIGHT SOURCES BY REFLECTION

[75] Inventors: William T. Plummer, Concord; Jeffrey W. Roblee, Watertown; Douglas S. Goodman, Sudbury, all of Mass.

[73] Assignee: Polaroid Corporation, Cambridge, Mass.

[21] Appl. No.: 08/885,637

[22] Filed: Jun. 30, 1997

[51] Int. Cl.[6] .............................. G02B 27/10; G02B 5/08; G02B 5/04
[52] U.S. Cl. ............................................. 359/627; 359/850
[58] Field of Search ...................... 359/627, 834, 359/835, 850, 851, 852, 853, 854, 855, 856, 857, 858, 859, 860, 861, 862, 863, 864, 865, 866

[56] References Cited

U.S. PATENT DOCUMENTS

| | | |
|---|---|---|
| 4,203,673 | 5/1980 | Buckson ................................... 356/446 |
| 4,633,891 | 1/1987 | Mattei et al. ............................. 131/281 |
| 5,012,477 | 4/1991 | Mesquida et al. ........................ 372/50 |
| 5,161,064 | 11/1992 | Clark et al. .............................. 359/663 |
| 5,221,971 | 6/1993 | Allen et al. .............................. 358/459 |
| 5,298,729 | 3/1994 | Wike, Jr. ................................. 235/467 |
| 5,315,428 | 5/1994 | Peng ....................................... 359/216 |
| 5,548,610 | 8/1996 | Bouadma et al. ........................ 372/99 |
| 5,574,592 | 11/1996 | Sano et al. ............................... 359/211 |

FOREIGN PATENT DOCUMENTS 0 627 667 A1  4/1994  United Kingdom .

OTHER PUBLICATIONS

Alexander H. Slocum; *Precision Machine Design;* pp. 236–239 and 325–326; 1992; Prentice–Hall, Inc.
XP–002076986, Alexander, H. Slocum, "Precision Machine Design", 1992, Prentice Hall, New Jersey, see p. 325, para. 3–p. 326, para. 1.
European International Search Report for PCT/US 98/12757.

*Primary Examiner*—Georgia Epps
*Assistant Examiner*—Ricky Mack
*Attorney, Agent, or Firm*—Donald F. Mofford

[57] ABSTRACT

A device for redirecting beams of light emitted from different sources includes: a monolithic stationary substrate having alignment surfaces for aligning the device for mounting into a system; multiple facets resident on the substrate including at least two facets having surfaces for redirecting the beams of light emitted from different sources; and facet edges on the substrate demarcating each of the multiple facets from one another, the edges providing outside corners greater than π radians between surfaces of adjacent multiple facets. The surfaces of the multiple facets are preferably surfaces of revolution created by cutting the facet surfaces while the device is rotated about a common axis, for instance, by machining via single diamond point turning.

24 Claims, 8 Drawing Sheets

MONOLITHIC MULTI-FACETED MIRROR FOR COMBINING MULTIPLE BEAMS FROM DIFFERENT LIGHT SOURCES BY REFLECTION

BACKGROUND OF THE INVENTION

Optical radiation, particularly laser light, is used extensively in communications, medicine, research, imaging, and in many other areas of technology. In such applications, laser radiation may be used directly or may be used as an intermediate pump source for purposes of promoting amplification or subsequent laser action. When an application's power requirements are small, on the order of several milliwatts more or less, and beam quality is not an overriding concern, laser diodes have been extensively employed because they are directly modulatable and of convenient size and acceptable beam quality. Where modest power is needed, on the order of a watt or so with superior beam quality, such as a diffraction-limited spot, optical fiber lasers with solid state pump sources have been used. For higher power applications where several watts may be needed, as in certain printing applications, use has been made of laser diode arrays as pump sources coupled to special fiber gain structures. For even higher power requirements, ten watts or more, high power laser diode arrays, whose cavities emit a few modes, may be coupled to such specialty gain fibers. However, care must be taken to assure efficient coupling power if maximum power benefit is to be achieved. Since single-mode cores are small, 10 µm or less, and typical materials limit the size of fiber numerical apertures (NA), it is virtually impossible to efficiently couple multimode laser array energy directly into single-mode gain cores via endfire coupling techniques.

As mentioned above, high-power laser light can be obtained by combining the outputs from the emitting cavities of laser diode arrays. This typically is achieved by either focusing a plurality of laser beams onto a single point, or combining a plurality of laser beams into a focused beam pattern. The latter case is illustrated in U.S. Pat. No. 5,221, 971 issued Jun. 22, 1993 to Allen et al. which discloses a printing method for combining a plurality of different sized laser beams into a beam pattern on a thermally sensitive medium for the purpose of producing hardcopy consisting of pixels whose size can be changed by area modulation to suit tonal content and detail while still maintaining a large number of gray levels per pixel. A beam pattern as disclosed by Allen et al. is illustrated in FIG. 5A herein.

Figure 3:
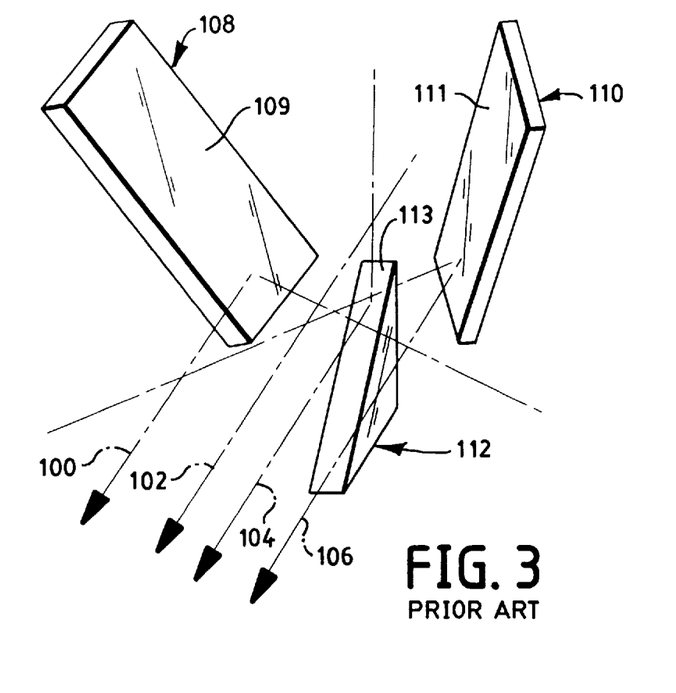
FIG. 3 illustrates a conventional mirror arrangement for redirecting beams from four different laser sources into a singular parallel bundle to generate a predetermined exposure pattern on a medium.
Figure 5A:
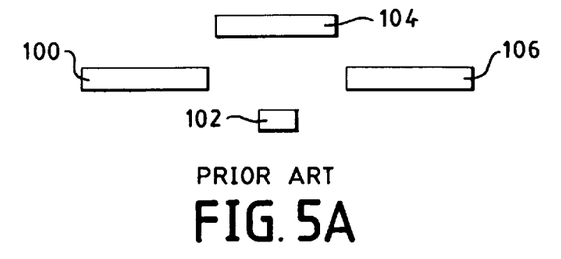
FIG. 5A illustrates a first laser beam pattern.

In order to redirect a number of laser beams to form a laser pattern as shown in FIG. 5A, numerous separate discrete mirrors are utilized. For instance FIG. 3 shows four parallel laser beams 100, 102, 104 and 106 where beam 102 passes to the medium without reflection, beam 100 is reflected from a surface 109 of mirror 108, beam 106 is reflected from a surface 111 of mirror 110 and beam 104 is reflected from a surface 113 of mirror 112. In this case, a minimum of three mirrors positioned at various angles is required to direct the four laser beams into a parallel configuration. It is necessary to provide even more mirrors when it is desired to reflect a greater number of laser beams into a single pattern of parallel beams. The use of multiple mirrors becomes tedious and cumbersome, since each mirror must be perfectly aligned for proper operation. In other words, every mirror must be individually machined, installed and calibrated for use with a particular device. Precise changes in positioning of the mirrors is necessary yet difficult for proper beam alignment due to mechanical constraints.

It is an object of the current invention to provide a monolithic stationary multi-faceted mirror which is easy to machine, easy to install within tolerance without further calibration, and capable of reflecting two or more beams of light, preferably laser radiation, without detrimental feedback into the lasers from reflections of unwanted parts of the beams.

Other objects of the invention appear hereinafter and become apparent when reading the following detailed description in conjunction with the accompanying drawings.

SUMMARY OF THE INVENTION

A device for redirecting beams of light emitted from different sources includes: a monolithic stationary substrate having alignment surfaces for aligning the device for mounting into a system; multiple facets resident on the substrate including at least two facets having surfaces for redirecting the beams of light emitted from different sources; and facet edges on the substrate demarcating each of the multiple facets from one another, the edges providing outside corners greater than π radians between surfaces of adjacent multiple facets. The surfaces of the multiple facets are preferably surfaces of revolution created by cutting the facet surfaces while the device is rotated about a common axis, for instance, by machining via single diamond point turning.

BRIEF DESCRIPTION OF THE DRAWINGS

The aforementioned aspects and other features of the invention are described in detail in conjunction with the accompanying drawings in which the same reference numerals are used throughout for denoting corresponding elements and wherein.

DETAILED DESCRIPTION OF THE PREFERRED EMBODIMENTS

Figure 1A:
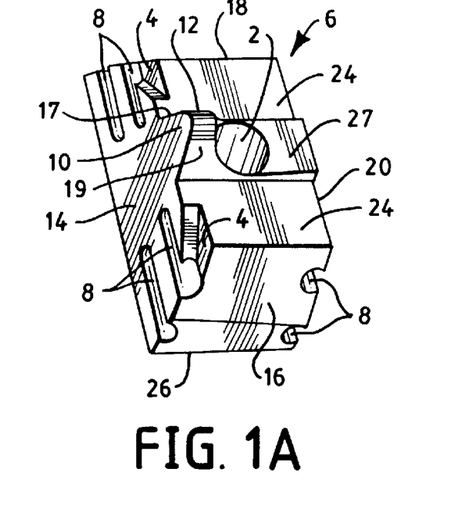
FIG. 1A is a front perspective view of a monolithic stationary six-faceted mirror in accordance with a first embodiment of the invention.
Figure 1B:
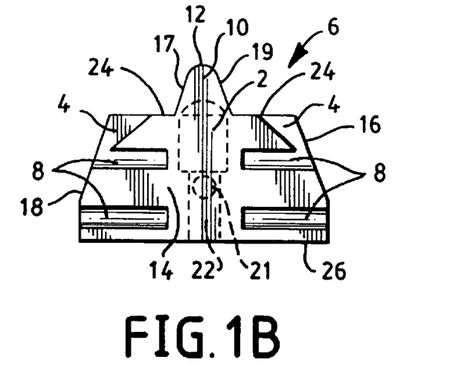
FIG. 1B is a bottom view of the monolithic stationary six-faceted mirror of FIG. 1A.
Figure 1C:
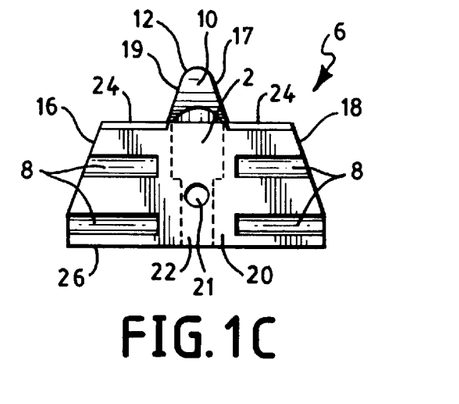
FIG. 1C is a top view of the monolithic stationary six-faceted mirror of FIG. 1A.
Figure 1D:
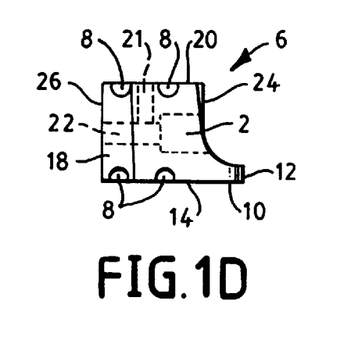
FIG. 1D is a rotated right side view of the monolithic stationary six-faceted mirror of FIG. 1A.
Figure 1E:
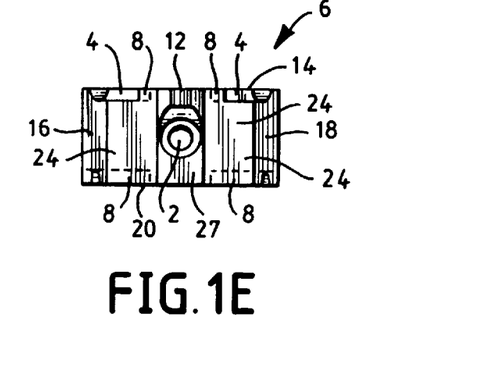
FIG. 1E is a front view of the monolithic stationary six-faceted mirror of FIG. 1A.
Figure 2A:
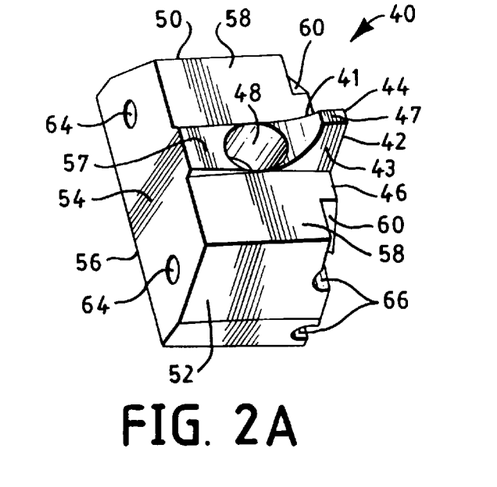
FIG. 2A is a front perspective view of a monolithic stationary two-faceted mirror in accordance with a second embodiment of the invention.
Figure 2B:
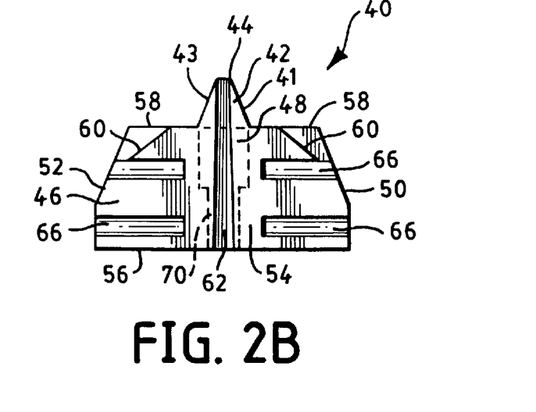
FIG. 2B is a bottom view of the monolithic stationary two-faceted mirror of FIG. 2A.
Figure 2C:
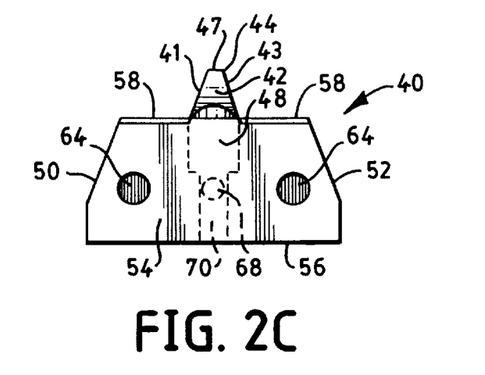
FIG. 2C is a top view of the monolithic stationary two-faceted mirror of FIG. 2A.
Figure 2D:
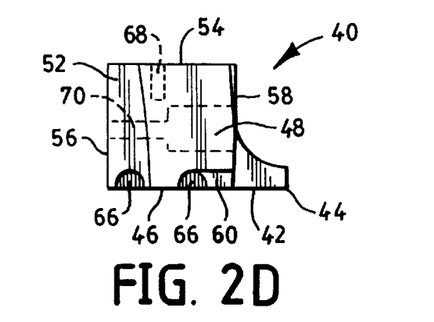
FIG. 2D is a rotated right side view of the monolithic stationary two-faceted mirror of FIG. 2A.
Figure 2E:
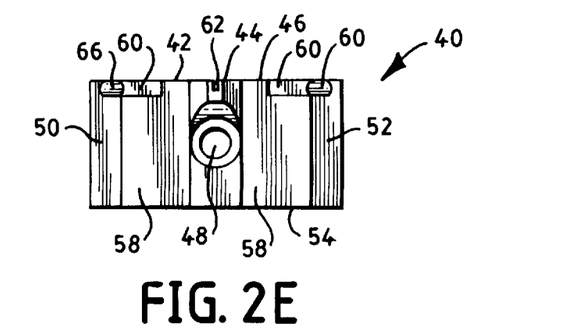
FIG. 2E is a front view of the monolithic stationary two-faceted mirror of FIG. 2A.

FIG. 1A shows a single piece of aluminum machined to include a monolithic stationary multi-faceted mirror in accordance with the principles of the current invention. The six facets 12 of the mirror nose 10 in FIGS. 1A through 1E are more clearly shown in FIG. 4. The machined piece 6 has front surfaces 24, a center surface 27, a back surface 26, a right surface 18, a left surface 16, a bottom surface 14 and a top surface 20. The piece 6 includes beveled surfaces 4 for allowing transmission of beams of light onto facets 12 of the mirror nose 10, which also includes dead facets 17 and 19 for properly truncating the beams of light. Although any type of light from any source at any frequency can be redirected by the mirror facets 12, the preferred embodiment utilizes laser light. Also, an active facet redirects or reflects a light beam incident thereon for productive use within the system, whereas a dead facet does not.

Figure 10:
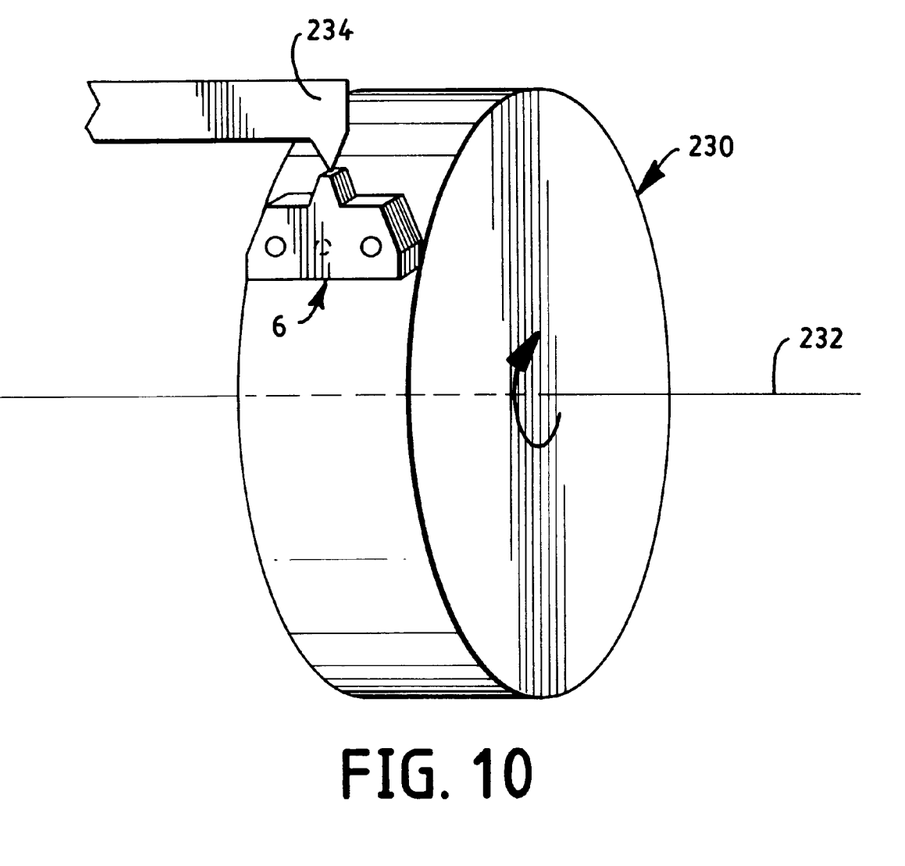
FIG. 10 is a perspective diagrammatic view of a preferred technique, i.e. single diamond point turning, of making a monolithic stationary multi-faceted mirror.

The bores 2, 21 and 22 accept bolts (not shown) for mounting the piece 6 onto a laser imaging system (not shown). Bore 2 accepts and recesses the head of a mounting bolt below the front surface 24. Slots 8 are filled with adhesive for further securing and preventing rotation of the piece 6. The mirror nose 10 of the piece 6 includes six facets 12 which were constructed by single point diamond turning. Although the surfaces of the mirror facets 12 could vary, such as being planar, conical or hyperbolic, in the preferred embodiment they are (conical) surfaces of revolution created by diamond turning. Diamond turning is a well known method for precision machining using a diamond cutting tool (see e.g. Precision Machine Design by Alexander H. Slocum, 1992, Prentice-Hall, Inc., pp. 236–239, 325–326). A piece 6 can be mounted as shown in FIG. 10 onto a rotating fixture 230. The fixture 230 rotates about an axis 232 while the cutting tool 234 moves parallel and perpendicular to the axis 230 in a manner similar to a lathe. In this way the mirror facets 12, the dead facets 17 and 19, the left surface 16, the right surface 18 and the front surfaces 24 are all cut as surfaces of revolution, i.e. surfaces cut while the piece 6 was rotating about a common axis 232. In this embodiment each of the surfaces of revolution 12, 16, 17, 18 and 19 are conical, whereas the front (alignment) surfaces 24 are cylindrical. Other known machining methods could be used to create surfaces on the piece 6 which are either planar or a surface of revolution.

The piece 6 is machined, as described above, so that the front surfaces 24, the left surface 16 and the right surface 18 are all useful as alignment surfaces for aligning the piece 6 into a mounting fixture within any system, either singly or in combination with another mirror piece. Furthermore, the mirror facets 12 are cut with sharp edges 13 (see FIG. 4) which allows the beams to be precisely redirected and truncated therefrom so that the reflected beams constitute a geometrically controlled pattern as long as the beams incident on the mirror facets 12 are larger than the facets 12. The facets 12 could be the same or different sizes. To ease fabrication, the mirror facet edges 13 can all constitute outside corners of the facets 12 so that the angle separating the reflective surfaces of adjacent facets 12 is always greater than $\pi$ radians. The design of the various angles of the incoming beams and the reflected beams is such that there is no overlap between reflected beams and no detrimental feedback from reflections (such as beyond mirror edges 13) of unwanted parts of the beams.

The six facets 12 of piece 6 are gold plated for increased reflectivity since the reflectivity of gold is about 95% compared to aluminum's reflectivity of about 75% at 840 nanometers. Piece 6 can be constructed from any machineable material, such as aluminum, brass, etc. The plating of the facets 12 is optional and could consist of other reflective coatings other than gold depending on cost and reflectivity considerations. Furthermore, the bores 2, 21 and 22, and the slots 8 could be otherwise situated or replaced with any other means for mounting the piece 6 into an imaging system. Finally, the shape and size of the piece 6 can be varied to allow a proper fit into any given imaging system, such as the system disclosed in commonly assigned case no. 8255, U.S. patent application Ser. No. 08/885,260, filed on even date herewith.

Figure 4:
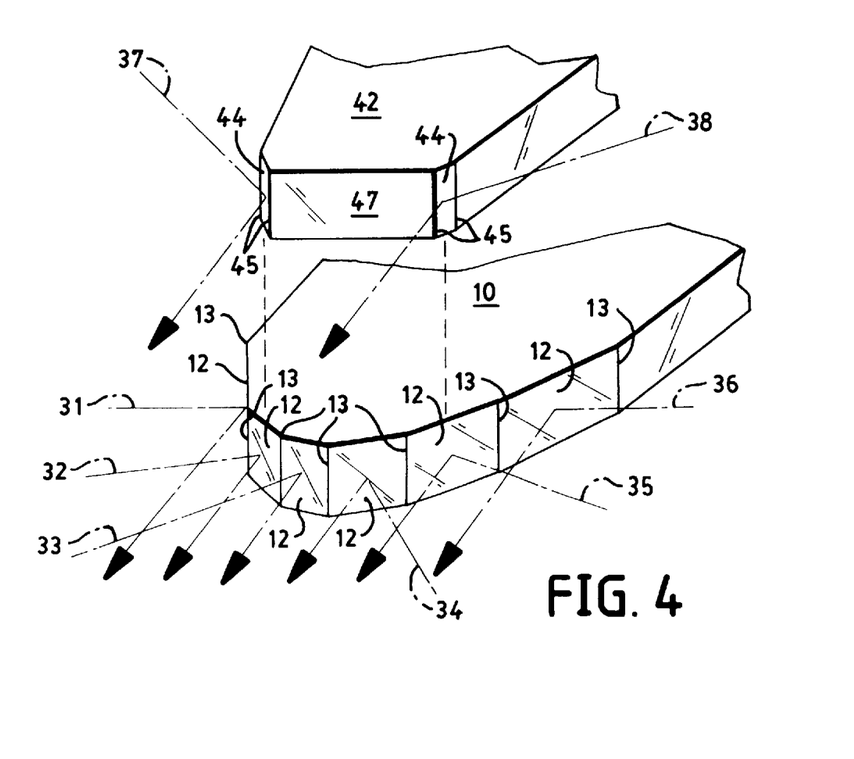
FIG. 4 illustrates the monolithic stationary six-faceted mirror of FIG. 1A combined with the monolithic stationary two-faceted mirror of FIG. 2A to produce a parallel bundle of eight beams from eight different laser sources to generate a predetermined exposure pattern on a medium.

A second embodiment of a monolithic stationary multi-faceted mirror machined in accordance with the principles of the current invention is illustrated in FIGS. 2A through 2E. The piece 40 is machined in a manner similar to the piece 6 of FIGS. 1A–1E except that the mirror nose 42 has but two mirror facets 44 separated by a dead facet 47 and flanked by dead facets 41 and 43 as shown in FIG. 4. The piece 40 has front surfaces 58, a center surface 57, a back surface 56, a right side surface 50, a left side surface 52, a top surface 54 and a bottom surface 46. The piece 40 includes beveled surfaces 60 for allowing transmission of beams of light onto the facets 44 of the mirror nose 42. Slot 62 is also designed to allow direct passage, without reflection, of a beam through the apex of the mirror nose 42. Bores 70, 64 and 48 accept bolts (not shown) for mounting the piece 40 onto a laser imaging system (not shown). Bore 48 accepts and recesses the head of a mounting bolt below the front surface 58, whereas slot 66 can be filled with adhesive for further securing and preventing rotation of the piece 40. The mirror nose 42 of the piece 40 includes two conical surface facets 44 which have been single point diamond turned as surfaces of revolution as previously described. The two facets 44 are then gold plated for increased reflectivity. The piece 40 is fabricated from any machineable metal, and the plating of the facets 44 is optional. Furthermore, the bores 48, 70 and 64, and slot 66 could be otherwise situated or replaced with other means for mounting the piece 40 onto an imaging system. The shape and size of the piece 40 can be varied to allow a proper fit into any given imaging system.

Figure 5B:
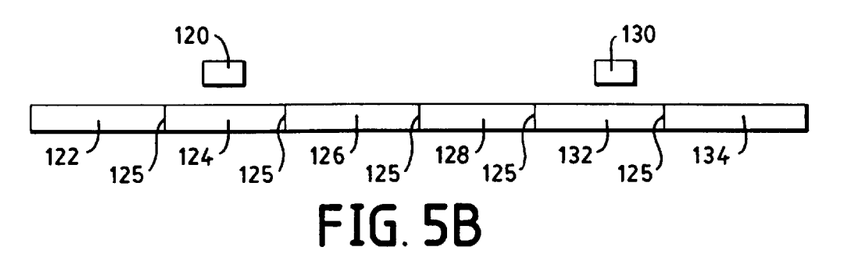
FIG. 5B illustrates a second laser beam pattern.
Figure 5C:
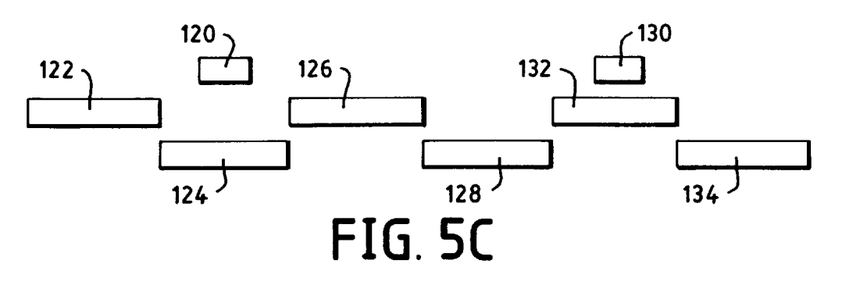
FIG. 5C illustrates a third laser beam pattern.
Figure 6:
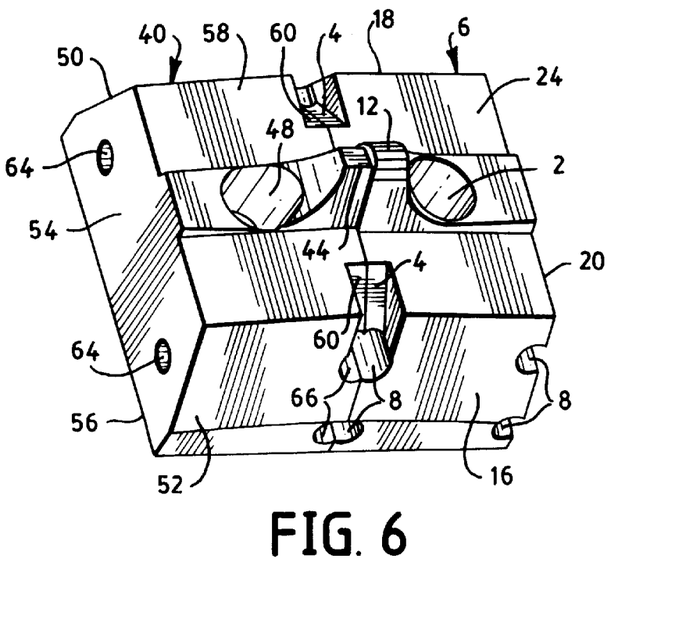
FIG. 6 is a front perspective view of the six-facet mirror of FIGS. 1A–1E mounted adjacent to the two-facet mirror of FIGS. 2A–2E to produce a parallel bundle of eight beams from eight different laser sources to generate a predetermined exposure pattern on a medium.
Figure 7:
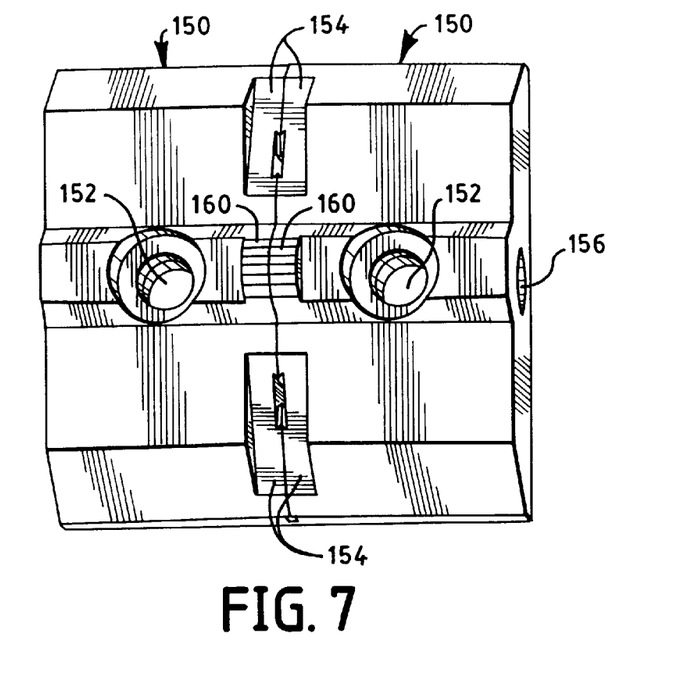
FIG. 7 is a front perspective view of a pair of four-facet mirrors mounted adjacent one another to produce a parallel bundle of eight beams from eight different laser sources to generate a predetermined exposure pattern on a medium.

The monolithic stationary multi-faceted mirrors according to the invention can be combined as shown in FIGS. 6 and 7. Any number of facets can be machined on each of the combined mirrors as previously described. In FIG. 6 the machined pieces 6 and 40 having monolithic stationary multi-faceted mirrors 12 and 44, respectively, are combined as shown to create, for instance, the beam patterns of FIGS. 5B or 5C. FIG. 4 shows a close-up view of the combined mirrors of FIG. 6. Each of the incoming laser beams 31, 32, 33, 34, 35, 36, 37 and 38 originates at a different laser source (not shown). Furthermore, the incoming beams are all reflected by the mirror facets 12 and 44 to create a parallel bundle of laser beams transmitted in the pattern shown in FIG. 5B. For proper operation of the system, the laser beams can be transmitted to any surface, such as a thermally-sensitive medium, a light-sensitive medium, a monitor, etc. Furthermore, the monolithic stationary multi-faceted mirrors can be used in any system where redirecting multiple beams of light is desirable, such as for pumping a solid-state laser such as a glass fiber laser, for printing, etc.

The edges 13 of the mirror facets 12 and the edges 45 of the mirror facets 44 act to truncate the adjacent laser beams so that the borders 125 between the beams (see FIG. 5B) are distinctly located. The angles of the facets 12 and 44 are predetermined to redirect the incoming beams by reflection into a parallel bundle. Specifically, the mirror facets 12 produce the laser beam pattern consisting of reflected beams 122, 124, 126, 128, 132 and 134 associated with source beams 36, 35, 34, 33, 32 and 31, respectively. The beams reflected from facets 12 are non-overlapping and precisely located by borders 125 corresponding to the mirror edges 13. Reflected beams 120 and 130 correspond to incoming beams 38 and 37, respectively, from the mirror facets 44. They are also precisely dimensioned and oriented due to the sharp mirror edges 45. Their separation is due to the dead facet 47.

If desired, more than one incoming laser beam could be reflected at slightly different elevations along the same facet 12 or 38 to generate, for instance, the beam pattern of FIG. 5C. To create a beam pattern with specific spacing requirements between adjacent beams, additional dead facets could be introduced into the design of the mirror so that no laser light would be reflected into the parallel bundle therefrom.

FIG. 7 shows yet another embodiment of two joined machined pieces 150, each having a monolithic stationary multi-faceted mirror with four facets 160. The pieces 150 include mounting bores 152 and 156 and bevels 154 to allow clear transmission of laser beams to the reflective facets 160. They are otherwise similarly constructed to the previous described pieces 6 and 40.

Figure 5D:
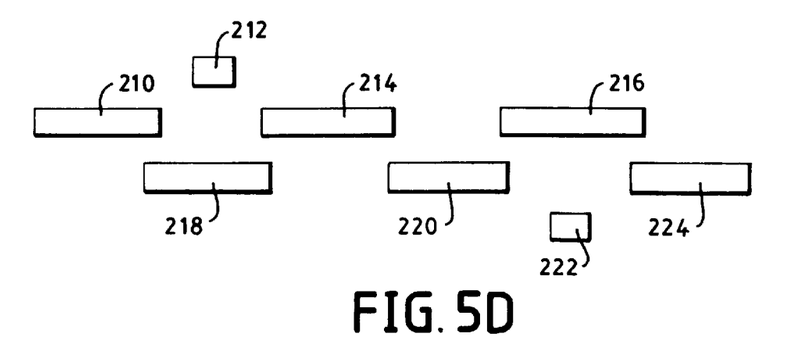
FIG. 5D illustrates a fourth laser beam pattern.

The combination of mirrors in FIG. 7 could produce the beam pattern of FIG. 5D where one set of mirror facets 160 is represented by beams 210, 212, 214 and 216, and the second set of mirror facets 160 is represented by beams 218, 220, 222 and 224. In this example, beams 210, 214 and 216 could encompass the full width of the wide facets 160 whereas beam 212 encompasses a smaller width facet. The spaces between beams 214 and 216, 212 and 214, and 210 and 212 represent dead facets. A similar analysis is applicable to the positioning of the second group of beams 218, 220, 222 and 224. With this arrangement of dead and active facets, the large beams 210, 218, 214, 220, 216 and 224 can have overlapping widths.

Figure 8:
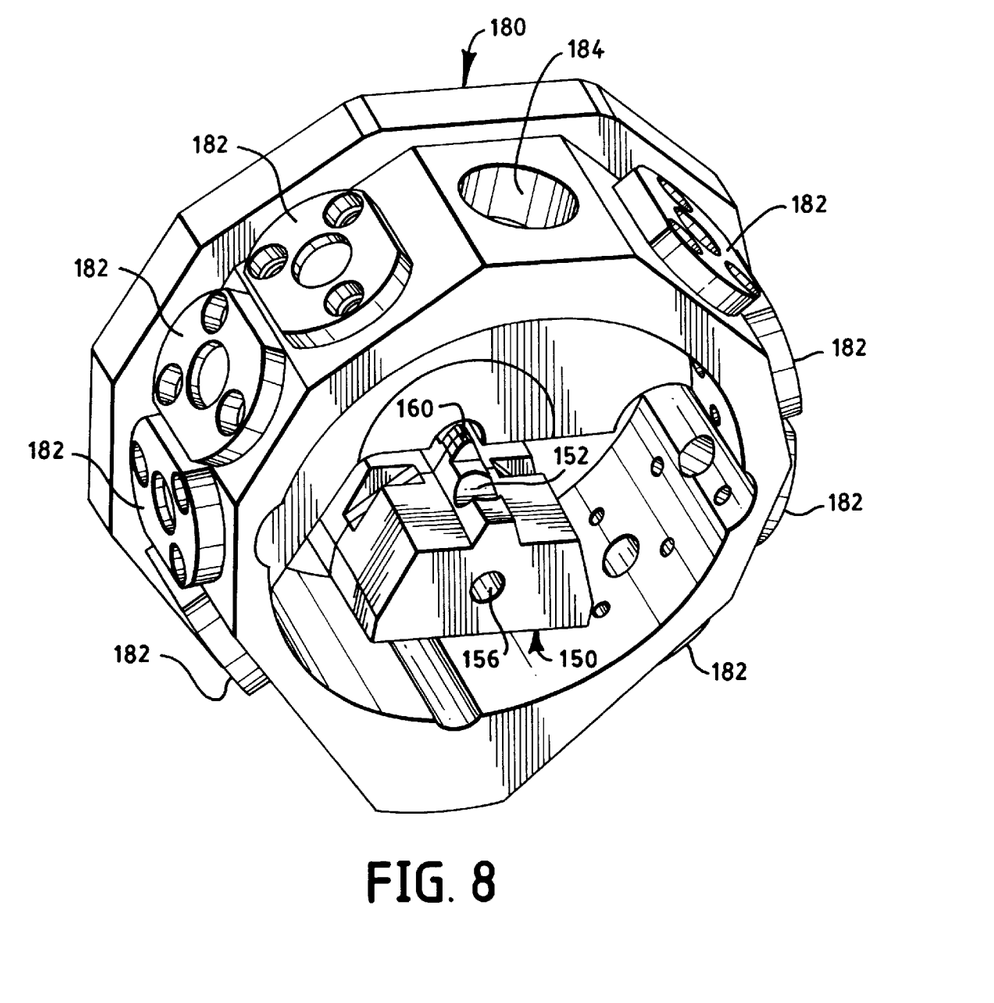
FIG. 8 is a perspective view of the joined pair of four-facet mirrors of FIG. 7 installed into a mirror mounting fixture.
Figure 9:
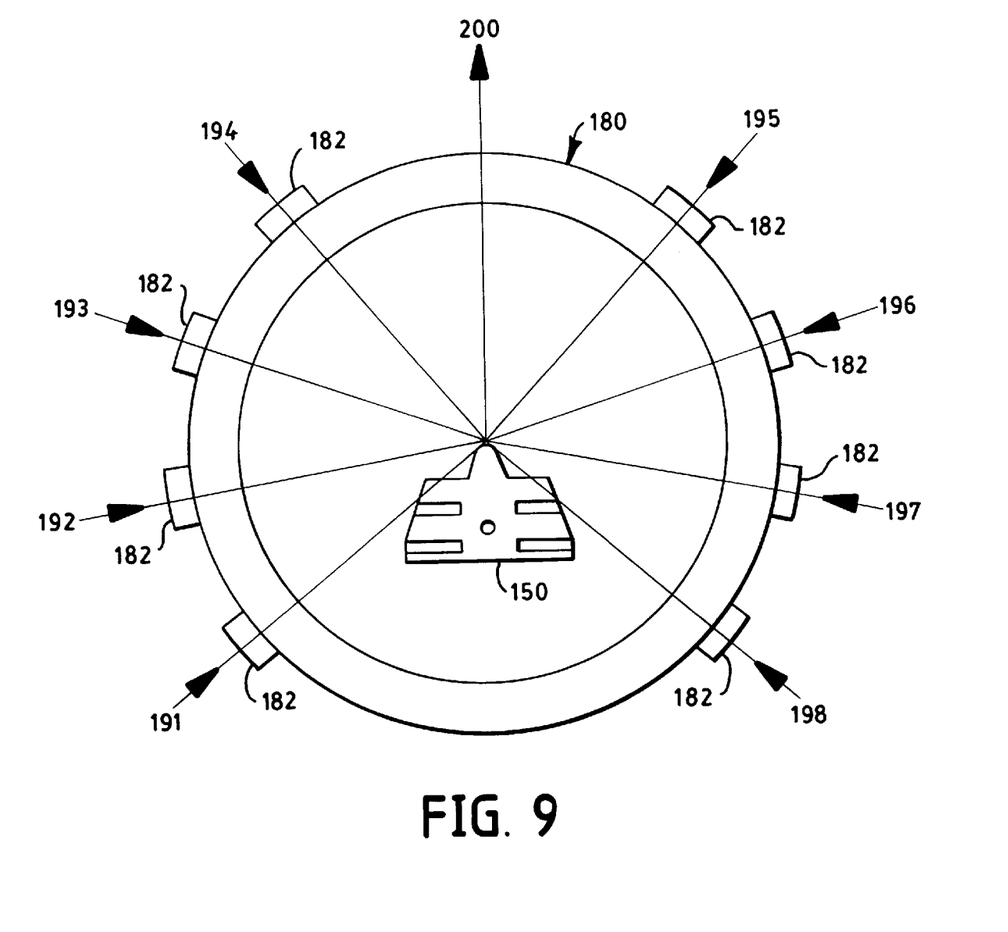
FIG. 9 is a diagrammatic view of the laser beam paths which are reflected from the joined pair of four-facet mirrors as mounted in FIG. 8.

The various machined pieces as described above can, either singly or in combination, be mounted into a mirror mounting fixture 180 as shown in FIGS. 8 and 9. Each laser beam 191, 192, 193, 194, 195, 196, 197 and 198 is transmitted from a different laser source through a ring lens 182 which focuses each respective beam onto one mirror facet 160. The beams are thereafter reflected by the mirror facets 160 and redirected into a parallel bundle 200 for generating a particular beam pattern, for example, upon an imaging medium (not shown).

Although the preferred embodiment described throughout the specification describes redirecting laser beams into a parallel bundle, i.e. a group of parallel beams for creating a specified beam pattern, it is wholly within the scope of the invention to redirect beams of light into a pattern of non-parallel beams, or a combination of parallel and non-parallel beam, or separately parallel groups of beams, or the beams could all be redirected to a singular point.

One or more of the redirected beams could be used for a first purpose such as image exposure while other redirected beams could be used for a second purpose such as alignment of an imaging medium being exposed. The surfaces of the mirror facets could be smooth or they could be diffractive such as for use in diffractive encoding. The shape of the mirror pieces 6, 40 and 150 described herein will vary for each particular application.

It is to be understood that the above described embodiments are merely illustrative of the present invention and represent a limited number of the possible specific embodiments that can provide applications of the principles of the invention. Numerous and varied other arrangements may be readily devised in accordance with these principles by those skilled in the art without departing from the spirit and scope of the invention as claimed.

We claim:

1. A device for redirecting beams of light emitted from different sources, the device comprising:
   a monolithic stationary substrate having alignment surfaces for aligning the device for mounting into a system;
   multiple facets resident on said substrate including at least two facets having surfaces for redirecting the beams of light emitted from different sources; and
   facet edges on said substrate demarcating each of said multiple facets from one another, said edges providing outside corners greater than $\pi$ radians between surfaces of adjacent said multiple facets.

2. The device of claim 1, wherein said facet surfaces are surfaces of revolution created by cutting said facet surfaces while the device is rotated about a common axis.

3. The device of claim 2, wherein said facet surfaces are conical surfaces of revolution.

4. The device of claim 1, wherein said alignment surfaces are surfaces of revolution created by cutting said alignment surfaces while the device is rotated about a common axis.

5. The device of claim 4, wherein said alignment surfaces are conical surfaces of revolution.

6. The device of claim 4, wherein said alignment surfaces are cylindrical surfaces of revolution.

7. The device of claim 1, wherein said beams of light are laser beams.

8. The device of claim 1, wherein at least one of said two facets having surfaces for redirecting light is a mirror facet.

9. The device of claim 1, wherein at least one of said two facets having surfaces for redirecting light is a diffractive facet.

10. The device of claim 1, wherein at least one of said two facets having surfaces for redirecting light is a mirror facet.

11. The device of claim 1, wherein at least one of said multiple facets is a dead facet.

12. The device of claim 1, wherein said redirected beams of light are oriented in parallel with one another.

13. The device of claim 12, wherein said parallel redirected beams generate a beam pattern for exposing an imaging medium.

14. A monolithic stationary device comprising:
multiple facets disposed on a substrate having at least two facets with surfaces to redirect beams of light emitted from different sources; and
means for demarcating each of said multiple facets from one another to provide greater than $\pi$ radians between surfaces of adjacent said multiple facets.

15. The device of claim 14, wherein said surfaces are surfaces of revolution created by cutting said surfaces while the device is rotated about a common axis.

16. The device of claim 15, wherein said surfaces of revolution are conical.

17. The device of claim 14 further comprising means for aligning the device for mounting into a system, wherein said alignment means includes surfaces of revolution created by cutting said surfaces while the device is rotated about a common axis.

18. The device of claim 17, wherein said surfaces of revolution of said alignment means are cylindrical.

19. The device of claim 14, wherein said beams of light are laser beams.

20. The device of claim 14, wherein at least one of said facets with surfaces to redirect beams of light emitted from different sources is diffractive.

21. A laser beam reflection device comprising a stationary monolithic mirror having at least two facets for reflecting a plurality of laser beams originating from at least two different sources into a parallel bundle focused upon a medium to generate a predetermined exposure pattern, each of said reflective facets separated from one another by an edge creating an angle greater than $\pi$ radians between surfaces of said reflective facets.

22. The device of claim 21, wherein each said reflective facet surface is a surface of revolution.

23. The device of claim 21, wherein each said reflective facet reflects more than one of said plurality of laser beams into said parallel bundle.

24. A method for redirecting beams of light emitted from different sources, the method comprising:
providing a monolithic stationary substrate having alignment surfaces for aligning the device for mounting into an imaging system;
providing multiple facets resident on said substrate including at least two facets having surfaces for redirecting the beams of light; and
providing facet edges on said substrate demarcating each of said multiple facets from one another, said edges providing outside corners greater than $\pi$ radians between surfaces of adjacent said multiple facets.

* * * * *